United States Patent [19]

Whetsel

[11] Patent Number: 5,744,949

[45] Date of Patent: Apr. 28, 1998

[54] ANALOG TEST CELL CIRCUIT

[75] Inventor: Lee D. Whetsel, Plano, Tex.

[73] Assignee: Texas Instruments Incorporated, Dallas, Tex.

[21] Appl. No.: 818,372

[22] Filed: Mar. 14, 1997

Related U.S. Application Data

[63] Continuation of Ser. No. 679,024, Jul. 12, 1996, abandoned, which is a continuation of Ser. No. 383,537, Feb. 2, 1995, abandoned, which is a continuation of Ser. No. 108,091, Aug. 17, 1993, abandoned.

[51] Int. Cl.$^6$ .................................................. G01R 31/28
[52] U.S. Cl. ........................................ 324/158.1; 324/763
[58] Field of Search .................................. 324/73.1, 763, 324/765, 158.1; 371/22.3, 22.6; 341/120, 121

[56] References Cited

U.S. PATENT DOCUMENTS

| | | | |
|---|---|---|---|
| 4,970,454 | 11/1990 | Stambaugh et al. | 324/73.1 |
| 5,225,834 | 7/1993 | Imai | 324/158.1 |
| 5,260,950 | 11/1993 | Simpson | 324/73.1 |
| 5,404,358 | 4/1995 | Russell | 371/22.3 |

OTHER PUBLICATIONS

John Novellino, "Standards Group Making Progress On Mixed-Signal Test Bus Standard", Electronic Design, May 27, 1993, p. 35.

IEEE P 1149.4 "Mixed-Signal Test Bus Standards Newsletter", Summer 1993, 3 pages (month unavailable).

"Proposed p1149.4 Analog Voltage Comparison Output", Wm. H. Smith, Minutes of p1149.4 Mixed-Signal Test Bus. Standard, Jun. 1993, Dallas, Texas.

"Proposed p1149.4 Analog Transfer Gate Output Multiplexor", Wm. H. Smith, Minutes of p1149.4 Mixed-Signal Test Bus. Standard, Jun. 1993, Dallas, Texas.

"A Proposed, p1149, Simple Analog Only Test Access", Wm. H. Smith, Minutes of p1149.4 Mixed-Signal Test Bus. Standard, Jun. 1993, Dallas, Texas.

Motorola Document MC54/74HC4051, High-Speed CMOS Logic Data, DL129, Rev 4, Mar. 1989, pp. 2-31 thru 2-34, 5-468 thru 5-479.

Motorola Document MC68HC11A8/D -1988 pp. 7-1 thru 7-5, pp. 9-6 thru 9-7 pp. 1-2 thru 1-3.

*Primary Examiner*—Ernest F. Karlsen
*Assistant Examiner*—Russell M. Kobert
*Attorney, Agent, or Firm*—Christopher L. Maginniss; W. James Brady III; Richard L. Donaldson

[57] ABSTRACT

An electrical circuit with test capability includes an analog signal path for carrying an analog signal, first and second nodes for use in testing the analog signal path, a first switching element connected to the first node, a second switching element connected to the second node, and a third switching element connected between the analog signal path and the first and second switching elements, whereby first and second test signal paths are respectively provided between the analog signal path and the first and second nodes.

7 Claims, 7 Drawing Sheets

ANALOG TEST CELL CIRCUIT

This application is a Continuation of application Ser. No. 08/679,024, filed on Jul. 12, 1996, entitled Analog Test Cell Circuit, now abandoned, which is a continuation under 37 CFR 1.62 of prior application Ser. No. 08/383,537 filed Feb. 2, 1995 and now abandoned which is a continuation under 37 CFR 1.62 of prior application Ser. No. 08/108,091 filed Aug. 17, 1993 and now abandoned.

FIELD OF THE INVENTION

The present invention relates generally to testing electrical circuitry and, more particularly, to improved analog test cells that permit testing analog circuitry.

BACKGROUND OF THE INVENTION

Digital testing at the board level is simplified through use of a boundary scan test standard referred to as ANSI/IEEE 1149.1. This standard uses digital test cells on an IC's I/O boundary to enable testing of digital wiring interconnections between ICs in a circuit.

In FIG. 1, an IC is shown which includes the 1149.1 digital boundary scan architecture. The logic required by 1149.1 is dedicated to test and cannot be reused for functional purposes. The components of an 1149.1 architecture are: a test access port (TAP), an instruction register, a boundary scan register, and a bypass register. The TAP responds to the test clock (TCK) and test mode select (TMS) inputs to shift data through the architecture from the test data input (TDI) to the test data output (TDO). The TAP also responds to a low active input on the optional test reset input (TRST) to initialize and disable the 1149.1 test logic.

The boundary scan register forms a test collar around the IC's application logic. All digital inputs and outputs are required to pass through the boundary scan register prior to being input to or output from the application logic. During normal IC operation, the boundary scan register is transparent, and system input and output signals pass freely through it without interruption. However, when the IC is placed in a boundary test mode, the normal system input/output operation of the IC is halted and a test input/output operation is enabled via the TAP and boundary scan register.

The 1149.1 instruction and data registers are connected in parallel between TDI and TDO. This parallel arrangement allows the TAP to shift data through either the instruction register or the data registers. Separation of instruction and data register scan operations simplifies the development of test access software. The following sections describe each component of the digital boundary scan architecture.

The TAP is a controller that responds to a test protocol to shift data through either the instruction register or a selected data register. TCK provides the TAP clock and TMS provides the control to operate the TAP. In the state diagram of FIG. 2, it is seen that the TAP consists of 6 steady states: test logic reset (TLRST), run test/idle (RT/IDLE), shift data register (SHIFT-DR), pause data register (PAUSE-DR), shift instruction register (SHIFT-IR), and pause instruction register (PAUSE-IR). The names of these steady states indicate their function, i.e. TLRST—resets the test logic, RT/IDLE—runs self tests or idles the test logic, SHIFT-DR/IR—shifts data from TDI to TDO, and PAUSE-DR/IR—pauses the shifting of data from TDI to TDO.

Transitions between steady states as well as required test actions are achieved via 10 temporary states: select data register scan (SELDRS), capture data register (CAPTURE-DR), exit1 data register (EXIT1-DR), exit2 data register (EXIT2-DR), update data register (UPDATE-DR), select instruction register scan (SELIRS), capture instruction register (CAPTURE-IR), exit1 instruction register (EXIT1-IR), exit2 instruction register (EXIT2-IR), and update instruction register (UPDATE-IR).

When the TAP is in its TLRST state, it issues a reset signal that forces the test logic into a condition that will not impede the normal operation of the host IC. At power up, the TAP enters the TLRST state in response to either an external reset input from the optional TRST input or from an internal reset signal generated by a power-up-clear circuit in the host IC. The TAP can also enter the TLRST state in five TCKs or less by setting the TMS input to a logic one. When test access is required, a logic zero TMS input causes the TAP to transition from the TLRST state to the RT/IDLE state.

From the RT/IDLE state a data register scan operation is achieved by transitioning the TAP through the SELDRS and CAPTURE-DR states to enter the SHIFT-DR state. Passing through the CAPTURE-DR state causes the selected data register to capture test data. In the SHIFT-DR state the selected data register shifts data from TDI to TDO. The TAP can be transitioned between the SHIFT-DR and PAUSE-DR states, via the EXIT1-DR and EXIT2-DR states, if pausing of the shift operation is required. The shift operation is terminated by transitioning the TAP from the SHIFT-DR state to the RT/IDLE state, via the EXIT1-DR and UPDATE-DR states. Passing through the UPDATE-DR state causes the data shifted into the selected data register to be output in parallel.

From the RT/IDLE state an instruction register scan operation is achieved by transitioning the TAP through the SELDRS, SELIRS and CAPTURE-IR states to enter the SHIFT-IR state. Passing through the CAPTURE-IR state causes the instruction register to capture status data. In the SHIFT-IR state the instruction register shifts data from TDI to TDO. The TAP can be transitioned between the SHIFT-IR and PAUSE-IR states, via the EXIT1-IR and EXIT2-IR states, if pausing of the shift operation is required. The shift operation is terminated by transitioning the TAP from the SHIFT-IR state to the RT/IDLE state, via the EXIT1-IR and UPDATE-IR states. Passing through the UPDATE-IR state causes the instruction shifted into the instruction register to be output from the instruction register's output latches. Following the UPDATE-IR state, the current instruction takes effect.

The instruction register is a multi-bit position shift register responsible for providing the control signals required to select and access a particular one of the 1149.1 data registers. The instruction register is accessed when the TAP receives an instruction register scan protocol via the TMS input. During an instruction register scan operation, the TAP selects the serial output from the instruction register to be output on TDO. A typical instruction register architecture is shown in FIG. 3. The instruction register consists of a shift register section, output latch section, and decode logic section.

The instruction shift register consists of a series of shift register bits arranged to form a single scan path between the TDI and TDO pins of the host IC. At the start of an instruction register scan operation, the TAP enters the CAPTURE-IR state and outputs control to cause the instruction shift register to capture status information. From the CAPTURE-IR state the TAP enters the SHIFT-IR state and outputs control to shift data through the instruction shift register from TDI to TDO.

The status inputs captured at the beginning of an instruction register scan operation are user-defined inputs, except for the two least significant bits, i.e. the two bits closest to TDO. The least significant bit always loads a logic one and the next to least significant bit always loads a logic zero. By always loading known but opposite logic values into the first two instruction bits shifted out, stuck-at fault locations on the serial data path between ICs can easily be detected and repaired.

The instruction output latches consists of a series of latches, one latch for each instruction shift register bit. During an instruction register scan operation the latches remain in their present state. However, when the TAP enters the UPDATE-IR state at the end of an instruction register scan operation, the TAP outputs control to cause the latches to update with the new instruction shifted into the instruction shift register.

The instruction decode logic is purely combinatorial and is responsible for decoding the latched instruction signals. The output from the decode logic provides the control required to select a data register and to set up the 1149.1 architecture to perform the task defined by the current instruction.

When the TAP enters its TLRST, by control input from TMS or by activation of the optional TRST pin, it outputs an internal reset signal to the instruction and data registers. In response to the reset signal, the instruction register is initialized to an instruction that enables normal operation of the host IC. Also in response to the TAP reset signal, update registers within the boundary register can be initialized to a predetermined safe state.

Data registers are defined to be all registers, excluding the instruction register, that are connected between TDI and TDO. The 1149.1 architecture of FIG. 1 includes the required bypass and boundary scan data registers. The instruction loaded into the instruction register determines which data register is selected for serial access during data scan operations. During data scan operations, the selected data register receives control from the TAP to capture test data, then shift test data from TDI to TDO. When one data register is being accessed, all other data registers remain in their present state.

The bypass register is selected between TDI and TDO when the instruction register is loaded with an 1149.1 Bypass, Clamp, or Highz instruction. The bypass register consists of a single scan cell. When selected, the bypass register loads to a logic zero when the TAP passes through the CAPTURE-DR state, then shifts data from TDI to TDO during the SHIFT-DR state. The bypass register provides an abbreviated scan path through the IC.

The boundary scan register consists of a series of digital test cells (DTCs) arranged to form a scan path around the application logic of the IC. DTCs associated with IC input signals must be capable of at least observing the logic value of the input signals. DTCs associated with output signals must be capable of observing and controlling the logic value of the output signals. DTCs associated with control signals, that regulate the state of 3-state output buffers, must be capable of observing and controlling the logic value of the control signals.

The boundary scan register is selected between TDI and TDO when the instruction register is loaded with an 1149.1 Extest or Sample/Preload instruction. When selected, the DTCs of the boundary scan register load test data when the TAP passes through the CAPTURE-DR state, then shift test data from TDI to TDO during the SHIFT-DR state.

DTCs associated with output and 3-state control signals are required to include an output latch so that the process of shifting data through the DTCs does not cause their outputs to ripple. At the end of a data scan operation, the TAP passes through the UPDATE-DR state and outputs control to cause the output latch to be updated with test data that was shifted into the DTC.

The input digital test cell (IDTC) 400 in FIG. 4A comprises a multiplexer 401 and flip flop 403 combination referred to herein as a capture/shift register (CSR), and the IDTC is identified by the box of FIG. 4B. The IDTC's CSR has a digital input (DI) and a scan input (SI), two control inputs: shift data register (SHIFTDR) and clock data register (CLKDR), and a scan output (SO) CLKDR is driven from TCK and is enabled during the CAPTURE-DR and SHIFT-DR states. DI is connected to a boundary input signal to be captured and shifted out for test observation. The CSR's SI and SO are connected to TDI and TDO either directly or through one or more other leading or following DTCs, as shown in FIG. 6. When the TAP enters the CAPTURE-DR state, the SHIFTDR input causes the IDTC to load data from DI. When the TAP enters the SHIFT-DR state, the SHIFTDR input causes the IDTC to shift data from SI to SO.

The output digital test cell (ODTC) 500 of FIG. 5A (symbolic cell block in FIG. 5B) is similar to the IDTC 400 except that it includes an update register (UR) 501, a further multiplexer 503, and a digital output (DO). In response to a RESET signal from the TAP, the UR is set to a predetermined safe state (in FIG. 5A the UR is set to a logic one). In response to the UPDATE signal from the TAP, the UR inputs data from the CSR and outputs the data to one input of the multiplexer 503. The other input of multiplexer 503 is connected to DI. The output of multiplexer 503 is connected to DO. The multiplexer 503 connects either the latch output or DI to DO in response to a MODE signal from the instruction register.

When the TAP passes through the CAPTURE-DR state, the SHIFTDR input causes the CSR to load data from DI. When the TAP is in the SHIFT-DR state, the SHIFTDR input causes the CSR to shift data from SI to SO. When the TAP passes through the UPDATE-DR state at the end of a data register scan operation, it outputs the UPDATE signal which causes the UR to load and output the data from the shift register.

During instructions that enable normal operation of the IC, MODE causes the multiplexer to connect DI to DO to allow normal operation of the output signal. During instructions that enable test operations, MODE causes the multiplexer to connect the output of the UR to DO so that test data can be output on the output signal. When in test mode, the UR prevents DO, and thus the output signal, from rippling as data is captured in and shifted through the CSR.

In FIG. 6, an example digital boundary scan register is shown surrounding an IC's application logic. The IC has two digital inputs (DIN) and two tristateable digital outputs (DOUT). Each input is coupled to a DI input of an IDTC 400 and each output passes through the DI to DO connections of an ODTC 500. Each tristate buffer 601 is connected to the DO output of an ODTC and is enabled or disabled by control output from the application logic which passes through an ODTC 500 in route to the tristate buffer control input. Also each tristate buffer receives enable and disable control input directly from the instruction register, as shown by the dotted line from the Instruction and TAP control box. All DTCs are connected together via their SI and SO connections to form a scan path from TDI to TDO. All DTCs receive control from the TAP and instruction register to perform capture, shift, and update operations in either a normal or test mode as previously described (see Instruction and TAP control box).

When an Extest instruction is loaded into the instruction register, the IC is placed in a test mode and the boundary scan register is selected between TDI and TDO. During Extest, the IC's outputs can be controlled by ODTCS and inputs can be observed by IDTCs during data register scan operations. This instruction allows wiring interconnections and combinatorial logic between ICs on a board to be easily tested.

When a Sample/Preload instruction is loaded into the instruction register, the IC remains in its normal mode and the boundary scan register is selected between TDI and TDO. The Sample/Preload instruction provides two functions, a test data sample function and a test data preload function. The test data sample function provides non-intrusive sampling of system data entering and leaving the IC during normal operation. The test data preload function provides for preloading the boundary register with test data prior to entering the Extest instruction.

When a Bypass instruction is loaded into the instruction register, the IC remains in normal mode and the bypass register is selected between TDI and TDO. The purpose of the Bypass instruction is to provide an abbreviated scan path through the IC from TDI to TDO.

When a Highz instruction is loaded into the instruction register, the IC is placed in a test mode and the bypass register is selected between TDI and TDO. During Highz, the IC's outputs are forced into a high impedance state by direct control input from the instruction register (as shown in FIG. 6), and data shifts through the bypass register during data register scan operations.

When a Clamp instruction is loaded into the instruction register, the IC is placed in a test mode and the bypass register is selected between TDI and TDO. During Clamp, preloaded test data in the ODTCs causes the IC's outputs to be driven to a logic one, zero, or tristate, and data shifts through the bypass register during data register scan operations.

In FIG. 7, a board 700 is shown with six ICs that include boundary scan. For clarity, only the boundary scan registers 701–706 of the ICs are shown. Serial access of the instruction and bypass registers is represented by the serial path shown through the TAP. The ICs are serially connected via TDI and TDO to provide a scan path from the connector's TDI input to TDO output. The ICs are parallel connected to the connector's TCK and TMS inputs.

Structural testing of the digital wiring interconnections between ICs is achieved by loading each IC with the Extest instruction. Prior to loading the Extest instruction, the boundary register of each functioning IC is preloaded with a predetermined test pattern using the Sample/Preload instruction. This preconditioning of the boundary register is required to avoid outputting unknown and potentially damaging test data when the Extest instruction is loaded.

When Extest is loaded, the ICs halt their functional operation and allow their inputs and outputs to be controlled solely by the boundary scan register. During Extest, data register scan operations are executed to cause each IC to output test stimulus from their outputs and input test response at their inputs, effecting a test of the wiring interconnections between ICs. This interconnection test checks for wiring open-circuit and short-circuit conditions. After the interconnection test is complete, the ICs are placed back into their function mode by loading each IC with a Bypass instruction.

On-line sampling of the digital input to and output from each IC during normal operation can be achieved by loading each IC with the Sample/Preload instruction. Data register scan operations performed while the Sample/Preload instruction is in effect cause the boundary register to capture data and shift it out for inspection.

In addition to the above-described testing of digital circuitry, it is also desirable to provide testing of analog signal interconnections between ICs in an analog circuit or a mixed signal circuit (having both analog and digital signals), using analog test cells placed at the IC boundaries.

When using analog test cells at an IC's boundary, two important things must be considered: (1) the analog test cell must be small in size, i.e. its design should use a minimum number of transistors, and (2) the analog test cell must have a minimal impact on the normal operation of the analog signal it is associated with, i.e. the test cell should introduce a minimum load and/or delay to the analog input or output signal.

FIG. 8 shows a mixed signal boundary register arrangement proposed in the prior art. This mixed signal boundary register is intended to exist within the architectural framework of the IEEE 1149.1 standard. In FIG. 8, an Input Analog Test Cell (IATC) 801 and an Output Analog Test Cell (OATC) 803 are shown in the boundary register along with an IDTC 400 and two ODTCs 500. The ATCs 801 and 803 have SI and SO connections for shifting data, and are similar to DTCs such as 400 and 500 in that they respond to instruction and TAP control input to enter test and normal modes, and to capture, shift, and update data.

The IATC 801 has SI, SO, an analog input (AI) terminal, and control input terminals for connection to the TAP. The AI terminal is connected to an analog input signal (AIN) of the mixed signal application logic. This connection allows the IATC to observe the analog input signal similarly to the way the IDTCs observe digital input signals.

The OATC 803 has SI, SO, an analog input (AI), an analog output (AO) terminals, and control input terminals for connection to the instruction register and TAP. The analog signal output from the mixed signal application logic is connected to the AI terminal and the analog output pin is connected to the AO terminal. These connections allow the OATC to observe and control the analog output signal similarly to the way the ODTCs observe and control digital output signals.

IATC and OATC each have two analog bus terminals, AB1 and AB2. The AB1 terminals of all ATCs are connected together and are further connected to an external IC pin. Likewise, the AB2 terminals of ATCs are connected together and are further connected to an external IC pin. The AB1 and AB2 buses are designed to facilitate a method of allowing an external tester to input an analog voltage, via say AB1, to one analog pin and measure the voltage, via say AB2, at other analog pins. Using AB1 and AB2, it is possible to test and measure elements, such as resistors, connected between analog output and input pins.

FIG. 9 illustrates a typical example of an OATC 803. The OATC comprises a comparator 901 (e.g. an operational amplifier), switches 1 through 5 (S1, S2, S3, S4, S5), and four scan control cells (SCC1–4). SCC1–4 are identical to the ODTC of FIG. 5A, except that the output multiplexer 503 of FIG. 5A is not included in SCC1–4, so that DO is connected directly to the output of the UR 501. One input to the comparator is connected to AO and the other is connected to a voltage reference (Vref). The comparator output is input to SCC4. The comparator outputs a one to SCC4's DI input if the voltage on AO is greater than Vref, otherwise it outputs a zero. In this and all following ATC examples, the switches S1–S5 are shown (for commonalty of operation, not a requirement) to open in response to a logic one input and close in response to a logic zero unless overriding control is specified, or, unless the switch is bubbled (as in S1) to indicate a reverse switch response to a logic one and zero signal input.

If S1 is enabled by a logic zero input from SCC3, S1 closes the connection between AO and the IC supply voltage (+V) in response to a high logic input from SCC4, and opens the connection in response to a low logic input from SCC4. If S2 is enabled by a logic zero input from SCC3, S2 opens the connection between AO and IC ground (G) in response to a high logic input from SCC4, and closes the connection in response to a low logic input from SCC4. If disabled by a logic one input from SCC3, S1 and S2 are forced open, independent of SCC4. S3 opens the connection between AO and AB1 in response to a high logic input from SCC1, and closes the connection in response to a low logic input from SCC1. S4 opens the connection between AO and AB2 in response to a high logic input from SCC2, and closes the connection in response to a low input from SCC2. S5 is opened and closed, disconnecting and connecting AI and AO, in response to instruction control input. During normal mode S5 is closed, and during test mode S5 is opened.

When an Extest instruction is loaded, the boundary register is connected between TDI and TDO and control comes from the instruction register to open S5 (test mode). During data scan operations, the TAP inputs control to capture, shift, and update the SCCs (as describe previously for the ODTCs) to control what signal(s) is connected to AO. At the beginning of a scan operation, SCC4 captures the logic state of AO to provide the test mode observability function previously described in relation to ODTC, and all other SCCs capture logic ones. At the end of a data scan operation, all SCCs update and output the data shifted in. The signal(s) connected to AO (AB1, AB2, +V, G), in response to the data from the SCCS, is output to neighboring IC analog inputs. Notice that S5 is open, disabling the signal connected to AO from driving the analog circuit connected to AI.

During Extest, the operation of S1 and S2 in response to logic one and zero outputs from SCC4 is analogous to the operation of an ODTC connected to a digital output. The operation of S1 and S2 in response to a logic one output from SCC3 is analogous to an ODTC tristating the output buffer of a digital signal. It is necessary to control S3 and S4, via SCC1 and SCC2, to their open position when outputting logic ones, zeros, and tristate conditions using SCC3 and SCC4, to keep signals on AB1 and AB2 from interfering with the boundary scan test operation.

During Extest, when analog measurement testing is being performed, SCC1 and SCC2 are set to connect AB1 and/or AB2 to AO. For example, if a connection is made between AB1 and AO, an external signal source could output signals from AO via AB1. Alternately, if a connection is made between AB2 and AO, an external signal monitor could receive signals from AO, via AB2. It is necessary to control S1 and S2, via SCC3 and SCC4, to their open position when inputting and outputting analog signals via AB1 and AB2 using SCC1 and SCC2, to keep +V and G from interfering with the measurement test operation.

The effect on AO of updating all combinations of outputs from the SCCs is shown below.

SCC1=0,SCC2=0,SCC3=0,SCC4=0: AO connected to G & AB1 & AB2

SCC1=1,SCC2=0,SCC3=0,SCC4=0: AO connected to G & AB2

SCC1=0,SCC2=1,SCC3=0,SCC4=0: AO connected to G & AB1

SCC1=1,SCC2=1,SCC3=0,SCC4=0: AO connected to G

SCC1=0,SCC2=0,SCC3=0,SCC4=1: AO connected to +V & AB1 & AB2

SCC1=1,SCC2=0,SCC3=0,SCC4=1: AO connected to +V & AB2

SCC1=0,SCC2=1,SCC3=0,SCC4=1: AO connected to +V & AB1

SCC1=1,SCC2=1,SCC3=0,SCC4=1: AO connected to +V

SCC1=0,SCC2=0,SCC3=1,SCC4=X: AO connected to AB1 & AB2

SCC1=1,SCC2=0,SCC3=1,SCC4=X: AO connected to AB2

SCC1=0,SCC2=1,SCC3=1,SCC4=X: AO connected to AB1

SCC1=1,SCC2=1,SCC3=1,SCC4=X: AO connected to none

When a Sample/Preload instruction is loaded, the boundary register is connected between TDI and TDO and control comes from the instruction register to close S5 (normal mode). During data scan operations, the TAP inputs control to capture, shift, and update the SCCs to control what signal(s) is connected to AO. At the beginning of a scan operation, SCC4 captures the logic state of AO (and AI via S5) to provide the normal mode observability function previously described in relation to ODTC, and all other SCCs capture logic ones. At the end of a data scan operation, all SCCs update and output the data shifted in. Data updated from the SCCs should not upset the normal mode signal. However, it is possible to update and connect to AO all the signal combinations shown in the Extest example above. This is a problem and should be avoided because it interferes with the normal mode of the IC. Therefore, care must be taken to only enable switches for observation purposes, e.g. S3 or S4 for observation by AB1 or AB2. Safe patterns to update are shown below.

SCC1=0,SCC2=0,SCC3=1,SCC4=X: AO connected to AB1 & AB2

SCC1=1,SCC2=0,SCC3=1,SCC4=X: AO connected to AB2

SCC1=0,SCC2=1,SCC3=1,SCC4=X: AO connected to AB1

SCC1=1,SCC2=1,SCC3=1,SCC4=X: AO connected to none

When a HighZ instruction is loaded, the bypass register is connected between TDI and TDO and control comes from the instruction register to open S5. Prior to loading Highz, SCC3 and SCC4 should be set to open S1 and S2.

When a Clamp instruction is loaded, the bypass register is connected between TDI and TDO and control comes from the instruction register to open S5. Prior to loading the Clamp instruction, SCC3 and SCC4 are loaded to connect AO to +V or G, or to neither when the Clamp instruction is loaded.

FIG. 10 illustrates a typical example of an IATC 801. With the exception of S5, IATC is identical to the OATC previously described. Without S5, AI and AO are electrically the same signal and referred to hereafter as AI/AO.

When an Extest instruction is loaded, the boundary register is connected between TDI and TDO and data scan operations capture, shift, and update the SCCs as previously described in the OATC. At the beginning of scan operations, SCC4 captures the logic state of AO to provide the observability function previously described, and all other SCCs capture logic ones. At the end of a data scan operation, all SCCs update and output the data shifted in. The AB1 and AB2 signals are selectively connectable to AI/AO and can be used for test observation via an external tester coupled to the AB1 and AB2 IC pins if desired. +V, G, AB1 and AB2 can selectively be connected to AI/AO to provide controllability of other IC inputs connected to AI/AO. The effect on AI/AO of updating all combinations of outputs from the SCCs is the same as previously shown with respect to the OATC 803.

When a Sample/Preload instruction is loaded, the boundary register is connected between TDI and TDO and data scan operations allow observation of AI/AO (and three logic ones) as previously described in the OATC. Data updated from the SCCs control what signal(s) is connected to AI/AO. Data updated from the SCCs should not upset the normal mode signal, therefore care must be taken to only enable switches for observation purposes. Safe patterns to update are the same as previously shown with respect to the OATC. Also the update precautions are the same as previously stated with respect to the OATC.

When a Highz instruction is loaded, the bypass register is connected between TDI and TDO. Prior to loading Highz, SCC3 and SCC4 should be set to open S1 and S2.

When a Clamp instruction is loaded, the bypass register is connected between TDI and TDO. Prior to loading the Clamp instruction, SCC3 is preloaded to open S1 and S2 because this is an input and should not drive out during Clamp. Also, SCC1 and SCC2 are preloaded to connect AI/AO to AB1, AB2, AB1 and AB2, or to neither AB1 or AB2.

The present invention provides input and output analog test cells that offer improvements over the prior art input and output analog test cells. The analog test cells according to the invention can be used in a boundary scan environment, and provide reduced loading effects on tested circuitry.

DETAILED DESCRIPTION

Figure 11:
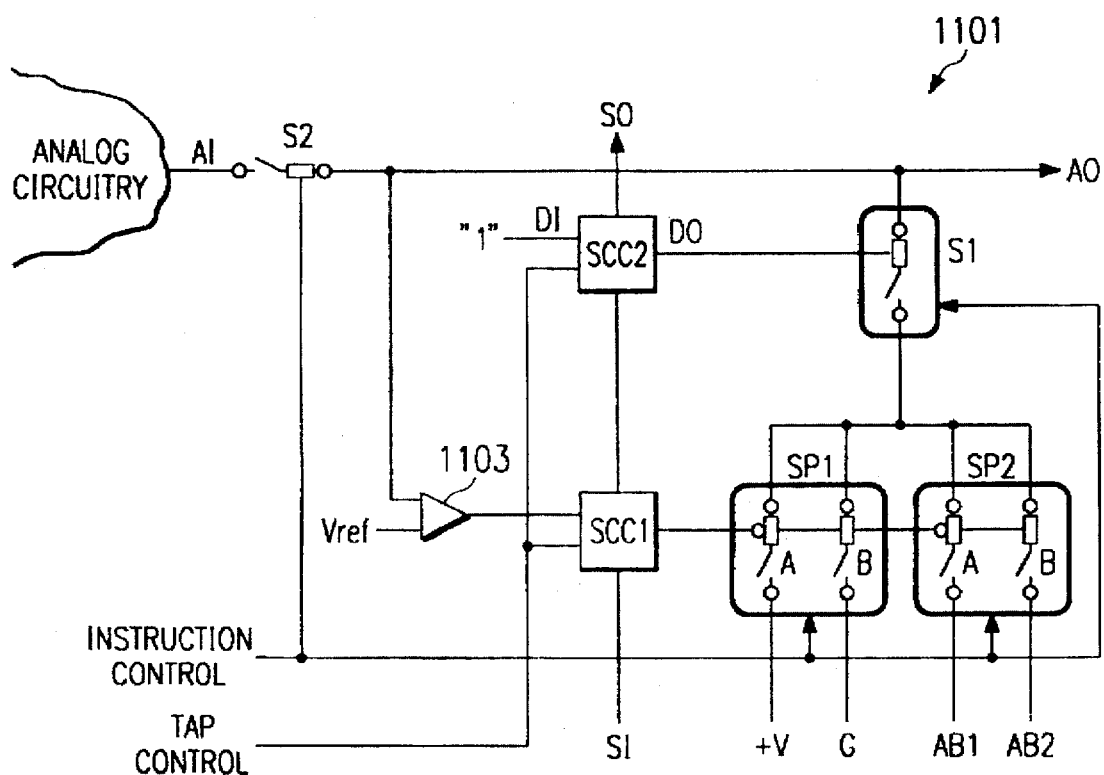
FIG. 11 illustrates an output analog test cell according to the present invention.

FIG. 11 illustrates an Improved Output Analog Test Cell (IOATC) 1101 of the present invention. The IOATC comprises a comparator 1103, switches 1 and 2 (S1, S2), switch pairs 1 and 2 (SP1, SP2), and two scan control cells (SCC1, SCC2). One input to the comparator is connected to AO and the other is connected to a voltage reference (Vref). The comparator output is input to SCC1. The comparator outputs a one to SCC1's DI input if the voltage on AO is greater than Vref, otherwise it outputs a zero.

If S is enabled by control input from the instruction register, S1 opens the connection between AO and the common connection between SP1 and SP2 in response to a high logic input from SCC2, and closes the connection in response to a low logic input from SCC2. S1 provides isolation between AO and SP1 and SP2 when opened. S1 is held open when disabled by control input from the instruction register. S2 is opened and closed, disconnecting and connecting AI and AO, in response to instruction control input. During normal mode S2 is closed, and during test mode S2 is opened.

Figure 9:
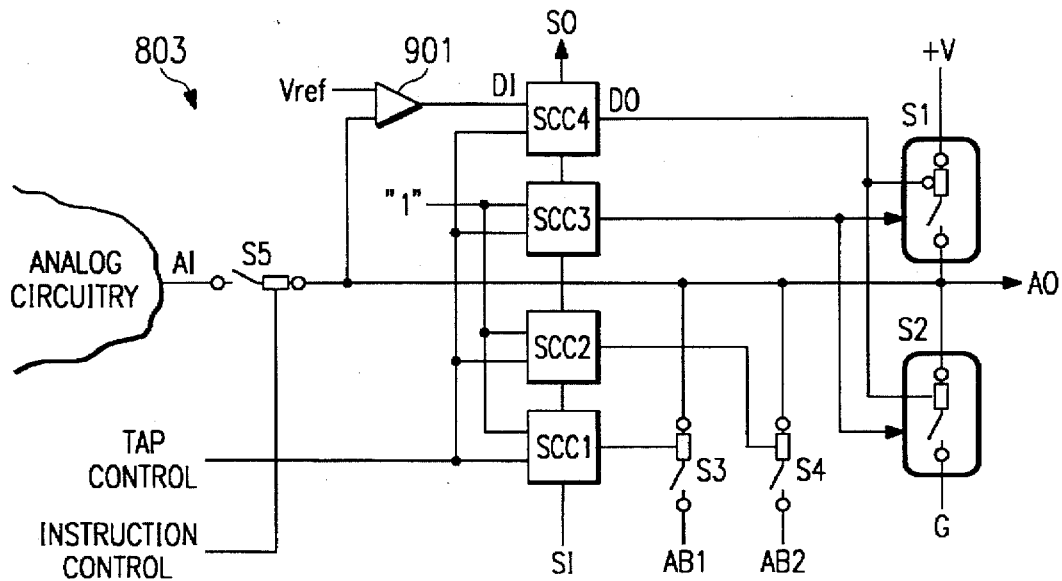
FIG. 9 illustrates a prior art output analog test cell.

It will be appreciated that isolation provided by S results in a loading of two loads on AO during normal mode: comparator 1103 and S1 (S1 is open during normal mode). In the prior art OATC of FIG. 9, in both test and normal modes, five loads are connected to AO: comparator 901, S1, S2, S3, and S4. Thus the performance, in normal mode, of the analog signal output on AO in the IOATC 1101 is improved over the signal output on AO of the prior art OATC.

If SP1 is enabled by control input from the instruction register, switch A of SP1 (SP1A) closes the connection between AO and +V and switch B of SP1 (SP1B) opens the connection between AO and G in response to a high logic input from SCC1. If SP1 is enabled by control input from the instruction register, switch A of SP1 (SP1A) opens the connection between AO and +V and switch B of SP1 (SP1B) closes the connection between AO and G in response to a low logic input from SCC1. SP1A and SP1B are held open when SP1 is disabled from the instruction register.

If SP2 is enabled by control input from the instruction register, switch A of SP2 (SP2A) closes the connection between AO and AB1 and switch B of SP2 (SP2B) opens the connection between AO and AB2 in response to a high logic input from SCC1. If SP2 is enabled by control input from the instruction register, switch A of SP2 (SP2A) opens the connection between AO and AB1 and switch B of SP2 (SP2B) closes the connection between AO and AB2 in response to a low logic input from SCC1. SP2A and SP2B are held open when SP2 is disabled from the instruction register.

During the following test examples, unless otherwise stated, SP1 will be enabled and SP2 disabled or SP2 will be enabled and SP1 disabled. This allows the A and B switches of both SP1 and SP2 to be controlled by a single SCC (SCC1). This improvement reduces circuitry in the IOATC and simplifies its operation as compared to the prior art OATC.

When an Extest instruction is loaded, the boundary register is connected between TDI and TDO and, in this example, control comes from the instruction register to open S2 (test mode), enable S1 and SP2, and disable SP2. During data scan operations, the TAP inputs control to capture, shift, and update SCC1 and SCC2 to control what signal is connected to AO. At the beginning of a scan operation, SCC1 captures the logic state of AO to provide the test mode observability function previously described in relation to ODTC, and SCC2 captures a logic one. At the end of a data scan operation, SCC1 and SCC2 update and output the data shifted in. If S1 is closed, the selected signal from SP1 is connected to AO to be output to neighboring IC analog inputs. Notice that S2 is open, preventing the signal connected to AO from driving the analog circuit connected to AI.

The effect on AO of updating all combinations of outputs from SCC1 and SCC2 is shown below.

SCC1=0,SCC2=0: AO connected to G (output logic zero)
SCC1=1,SCC2=0: AO connected to +V (output logic one)
SCC1=X,SCC2=1: AO connected to none (tristate/opened)

During Extest, the operation of the IOATC's SP1 in response to logic one and zero outputs from SCC1 is analogous to the operation of an ODTC connected to a digital output. The operation of the IOATC's S1 in response to a logic one input from SCC2 is analogous to an ODTC tristating the output buffer of a digital signal.

It will be appreciated that the IOATC cannot be made to connect AO to AB1 or AB2 during scan testing, as can the prior art OATC, since SP2A and SP2B of SP2 are forced open (i.e., SP2 is disabled) by the Extest instruction.

When a Sample/Preload instruction is loaded, the boundary register is connected between TDI and TDO and control comes from the instruction register to close S2 (normal mode), and disable S1, SP1, and SP2. During data scan operations, the TAP inputs control to capture, shift, and update SCC1 and SCC2. At the beginning of a scan operation, SCC1 captures the logic state of AO to provide the normal mode observability function previously described, and SCC2 captures a logic one. The data updated at the end of a data scan operation does not affect S1, SP1A, SP1B, SP2A or SP2B, since they are disabled to the open switch position.

When a Clamp instruction is loaded, the bypass register is connected between TDI and TDO and control comes from the instruction register to open S2, disable SP2, and enable S1 and SP1. Prior to loading the Clamp instruction, SCC1 and SCC2 are loaded to connect AO to +V, G, or to nothing when the Clamp instruction is loaded.

When an analog measurement instruction is loaded, the boundary scan register is connected between TDI and TDO and control comes from the instruction register to open S2 (test mode), enable S1 and SP2, and disable SP1. When enabled, SP2 and S1 are controlled by input from SCC1 and SCC2, respectively, to connect AB1 or AB2 to AO to facilitate analog measurement and testing by an external device. For example, if a connection is made between AB1 and AO, an external signal sourcing device connected to AB1 could input signals to AO to be output from the IC pin. Alternately, for example, if a connection is made between AB2 and AO, an external signal monitoring device connected to AB2 could receive signals arriving at the IC pin via the AO.

Figure 8:
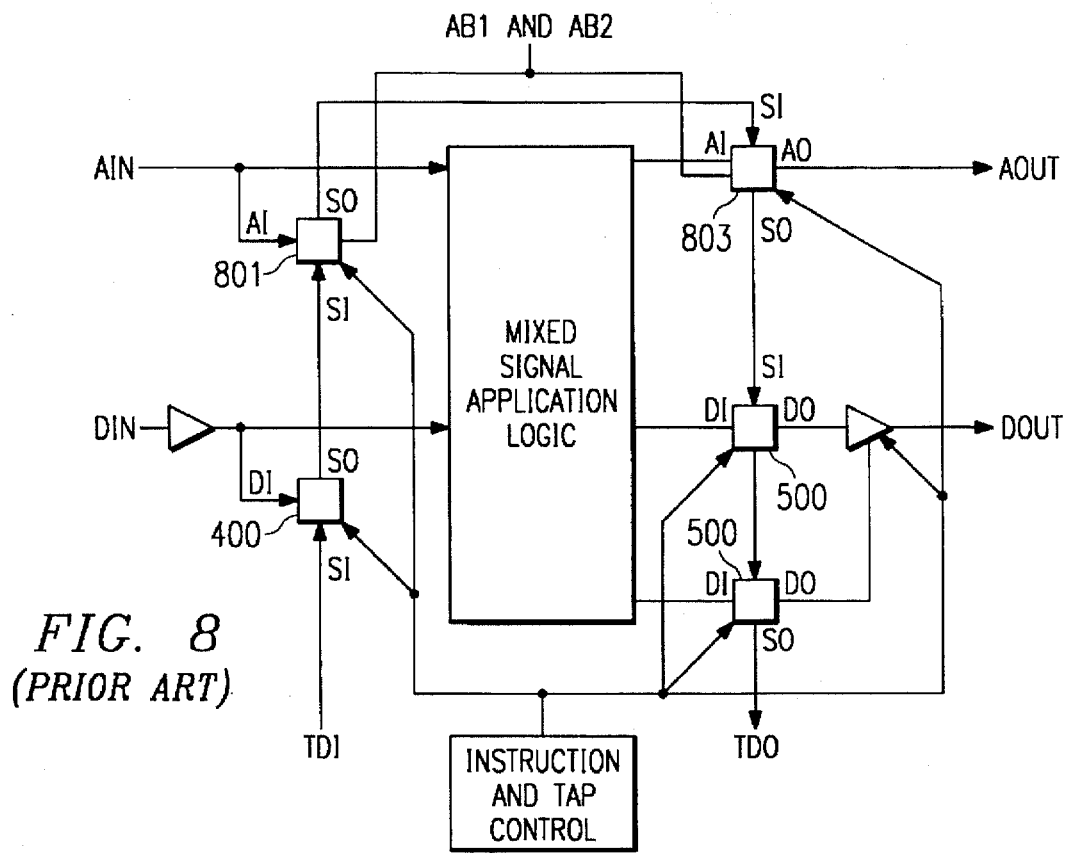
FIG. 8 is similar to FIG. 6, but shows the boundary scan register of FIG. 1 as implemented in the prior art using both digital and analog test cells.

The analog measurement instruction of the present invention is preferably designed to make the IDTCs 400 and ODTCs 500 of FIG. 8 respond as though it were an Extest instruction.

It will be appreciated that this mode of analog measurement is not combined with the Extest operation as in the prior art analog test cells. In the present invention, an instruction is defined which allows the analog measurement test to be independent from Extest, so that only AB1 and AB2 are used during the test.

Figure 12:
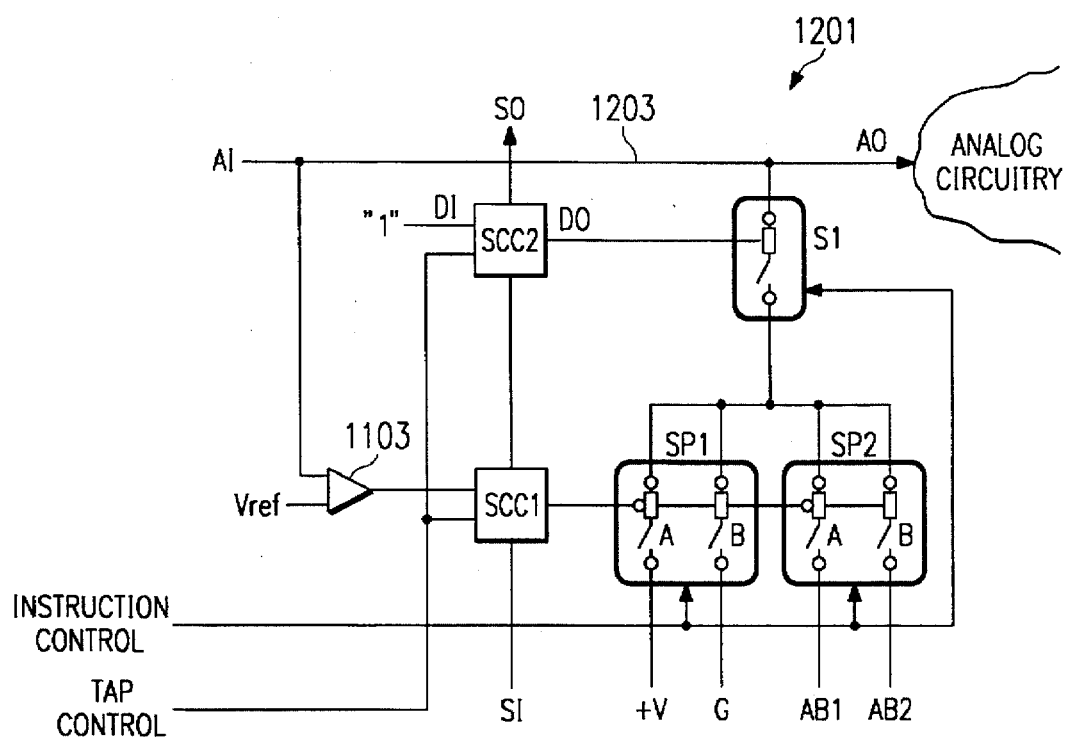
FIG. 12 illustrates an input analog test cell according to the present invention.

FIG. 12 illustrates the Improved Input Analog Test Cell (IIATC) 1201 of the present invention. The IIATC 1201 is similar to the IOATC in that it comprises comparator 1103, S1, SP1, SP2,. SCC1 and SCC2. One input to the comparator is connected to the AI/AO bus 1203 and the other is connected to a voltage reference (Vref). The comparator output is input to SCC1. The comparator outputs a one to SCC1's DI input if the voltage on the AI/AO bus is greater than Vref, otherwise it outputs a zero.

S2 of the IOATC 1101 is not included in the AI/AO bus 1203 of the IIATC 1201. However, in applications where it is necessary to block test signals from affecting the analog circuitry, a switch could be placed between the S1 connection on the AI/AO bus 1203 and the analog circuitry input (AO) for isolation purposes during Extest, HighZ, Clamp, and analog measurement instructions.

If S1 is enabled by control input from the instruction register, S1 opens the connection between the AI/AO bus and the common connection between SP1 and SP2 in response to a high logic input from SCC2, and closes the connection in response to a low logic input from SCC2. S1 provides isolation between AI/AO and SP1 and SP2 when opened. S1 is held open when disabled by control input from the instruction register.

Figure 10:
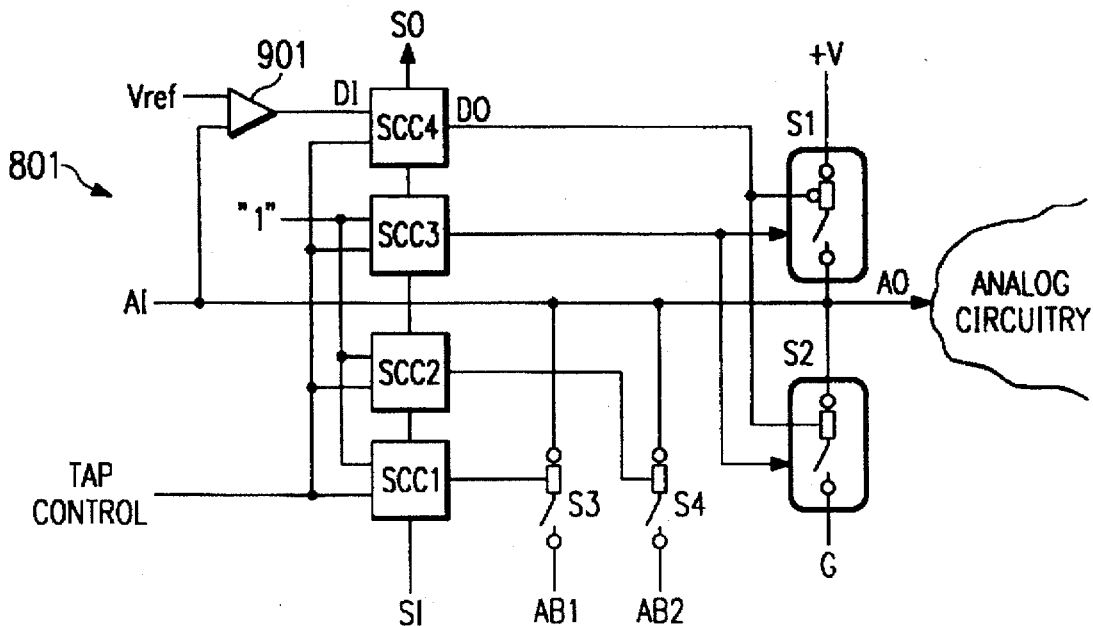
FIG. 10 illustrates a prior art input analog test cell.

It will be appreciated that isolation provided by S1 results in a loading of two loads on AI/AO during normal mode: comparator 1103 and S1 (S1 is open in normal mode). In the prior art IATC FIG. 10, in both test and normal modes, five loads are connected to AI/AO: comparator 901, S1, S2, S3, and S4. Thus the performance, in normal mode, of the analog signal input on AI/AO in the IIATC 1201 is improved over the signal input on AI/AO of the prior art IATC.

If SP1 is enabled by control input from the instruction register, switch A of SP1 (SP1A) closes the connection between AI/AO and +V and switch B of SP1 (SP1B) opens the connection between AI/AO and G in response to a high logic input from SCC1. If SP1 is enabled by control input from the instruction register, switch A of SP1 (SP1A) opens the connection between AI/AO and +V and switch B of SP1 (SP1B) closes the connection between AI/AO and G in response to a low logic input from SCC1. SP1A and SPIB are held open when SP1 is disabled from the instruction register.

If SP2 is enabled by control input from the instruction register, switch A of SP2 (SP2A) closes the connection between AI/AO and AB1 and switch B of SP2 (SP2B) opens the connection between AI/AO and AB2 in response to a high logic input from SCC1. If SP2 is enabled by control input from the instruction register, switch A of SP2 (SP2A) opens the connection between AI/AO and AB1 and switch B of SP2 (SP2B) closes the connection between AI/AO and AB2 in response to a low logic input from SCC1. SP2A and SP2B are held open when SP2 is disabled from the instruction register.

When an Extest instruction is loaded, the boundary register is connected between TDI and TDO and, in this example, control comes from the instruction register to enable S1 and SP1, and disable SP2. During data scan operations, the TAP inputs control to capture, shift, and update SCC1 and SCC2 to control what signal is connected to AI/AO. At the beginning of a scan operation, SCC1 captures the logic state of AI/AO to provide the test mode observability function, and SCC2 captures a logic one. At the end of a data scan operation, SCC1 and SCC2 update and output the data shifted in. If S1 is closed, the selected signal from SP1 is connected to AI/AO to be input to the analog circuitry.

The effect on AI/AO of updating all combinations of outputs from SCC1 and SCC2 is shown below.

SCC1=0,SCC2=0: AI/AO connected to G (output logic zero)

SCC1=1,SCC2=0: AI/AO connected to +V (output logic one)

SCC1=X,SCC2=1: AI/AO connected to none (tristate/opened)

During Extest, the operation of the IIATC's SP1 in response to logic one and zero outputs from SCC1 is analogous to the operation of an ODTC connected to a digital output. The operation of the IIATC's S1 in response to a logic one input from SCC2 is analogous to an ODTC tristating the output buffer of a digital signal.

When a Sample/Preload instruction is loaded, the boundary register is connected between TDI and TDO and control comes from the instruction register to disable S1, SP1, and SP2. During data scan operations, the TAP inputs control to capture, shift, and update SCC1 and SCC2. At the beginning of a scan operation, SCC1 captures the logic state of AI/AO to provide the normal mode observability function, and SCC2 captures a logic one. The data updated at the end of a data scan operation does not affect S1, SP1A, SP1B, SP2A or SP2B, since they are disabled to the open switch position.

When a Highz instruction is loaded, the bypass register is connected between TDI and TDO and control comes from the instruction register to disable S1, isolating AI/AO.

When a Clamp instruction is loaded, the bypass register is connected between TDI and TDO and control comes from the instruction register to disable SP2 and enable S1 and SP1. Prior to loading the Clamp instruction, SCC1 and SCC2 are loaded to connect AI/AO to +V, G, or to nothing when the Clamp instruction is loaded.

When an analog measurement instruction is loaded, the boundary scan register is connected between TDI and TDO and control comes from the instruction register to enable S1 and SP2, and disable SP1. When enabled, SP2 and S1 are controlled by input from SCC1 and SCC2, respectively, to connect AB1 or AB2 to AI/AO to facilitate analog measurement and testing by an external device. For example, if a connection is made between AB1 and AI/AO, an external signal sourcing device connected to AB1 could input signals to AI/AO to be input to the analog circuitry. Alternately, for example, if a connection is made between AB2 and AI/AO, an external signal monitoring device connected to AB2 could receive signals arriving at the analog circuitry via AI/AO.

The analog measurement instruction of the present invention is preferably designed to make the IDTCs 400 and ODTCs 500 of FIG. 8 respond as though it were an Extest instruction.

It will be appreciated that this mode of analog measurement is not combined with the Extest operation as in the prior art analog test cells. In the present invention, an instruction is defined which allows the analog measurement test to be independent from Extest, so that only AB1 and AB2 are used during the test.

Figure 13:
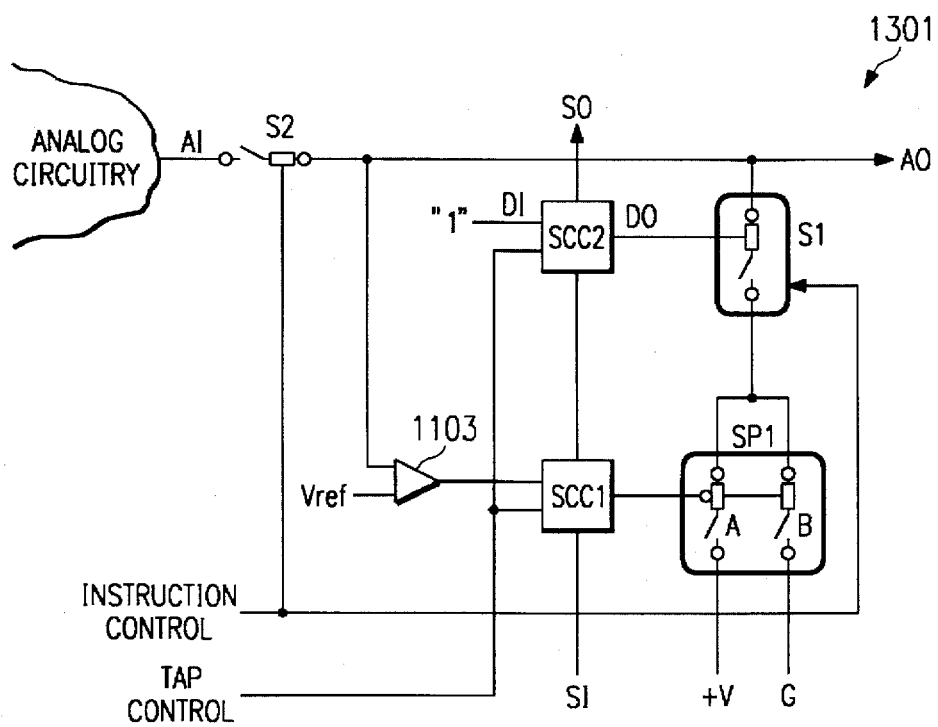
FIG. 13 illustrates another embodiment of an output analog test cell according to the invention.

If analog measurement instructions (i.e. instructions that use the AB1 and AB2 signals) are not required, the IOATC 1101 can be reduced to support only the Extest, Sample/Preload, Clamp, and Highz instructions previously described. An example of a Minimal Output Analog Test Cell (MOATC) 1301 capable of supporting these instructions is shown in FIG. 13. The MOATC is identical to the IOATC 1101 except that SP2 and the connections to AB1 and AB2 are not included in the MOATC 1301. The MOATC can operate in a boundary register as described with respect to the IOATC to provide scan testing of analog output pins using the Extest and Sample/Preload instructions. The MOATC can also operate in a boundary register to provide the Highz and Clamp instruction test features as previously described with respect to the IOATC. Since only SP1 is included in the MOATC, instruction control is not needed to enable and disable SP1 as it is in the IOATC where SP2 is also in the circuit. Therefore, SP1 is always enabled to be controlled by SCC1 to output a logic one (+V) or zero (G) on AO, if S1 is closed by SCC2. The MOATC retains the benefit of the isolation switch S1.

Figure 14:
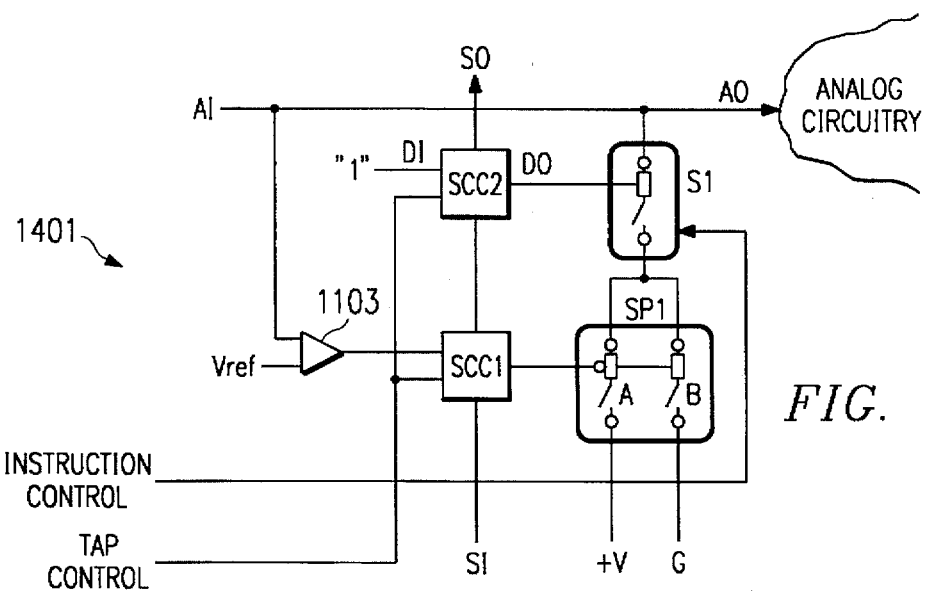
FIG. 14 illustrates another embodiment of an input analog test cell according to the invention.

If analog measurement instructions are not required, the IIATC 1201 can be reduced to support only the Extest, Sample/Preload, Clamp, and Highz instructions previously described. An example of a Minimal Input Analog Test Cell (MIATC) 1401 capable of supporting these instructions is shown in FIG. 14. The MIATC is identical to the IIATC 1201 except that SP2 and the connections to AB1 and AB2 are not included in the MIATC 1401. The MIATC can operate in a boundary register as described with respect to the IIATC to provide scan testing of analog input pins using the Extest and Sample/Preload instructions. The MIATC can also operate in a boundary register to provide the HighZ and Clamp instruction test features as previously described with respect to the IIATC. Since only SP1 is included in the MIATC, instruction control is not needed to enable and disable SP1 as it is in the IIATC where SP2 is also in the circuit. Therefore, SP1 is always enabled to be controlled by SCC1 to output a logic one (+V) or zero (G) on AI/AO, if S1 is closed by SCC2. The MIATC retains the benefit of the isolation switch S1.

Figure 15:
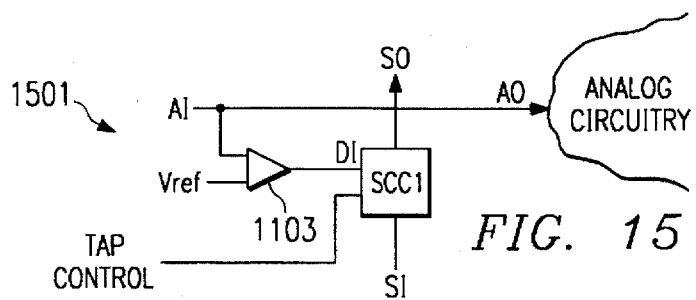
FIG. 15 illustrates an analog test cell according to the invention for use in test observation operations.

If sourcing of logic ones (+V) and zeros (G) from an analog input pin is not required, the MIATC 1401 of FIG. 14 can be further reduced to support only test observation features associated with the Extest and Sample/Preload instructions previously described. An example of an Observation Input Analog Test Cell (OIATC) 1501 is shown in FIG. 15. The OIATC 1501 is identical to the MIATC 1401 except that SCC2, S1, and SP1 are not included in the OIATC 1501. The OIATC can operate in a boundary register as described with respect to the IIATC to provide scan test observation of analog input pins during Extest and Sample/Preload instructions.

While the IOATC 1101 and IIATC 1201 have been shown to include two selectable switch pairs (SP1 and SP2) connected to the isolation switch S, additional switch pairs could be added as required. In the example output cell 1601 of FIG. 16, an On-Chip Analog Test Circuit is connectable to S1 via a third switch pair SP3. When connected to AO, via S1 and SP3, the On-Chip Analog Test Circuit can output Analog Test Stimulus (ATS) signals to and/or receive Analog Test Response (ATR) signals from the analog input or output it is connected to (AO in this case).

Using this approach, an analog output can be connected to the ATS output of the On-Chip Analog Test Circuit and an analog input can be connected to the ATR input of the same or a different On-Chip Analog Test Circuit. After the connection is made, the On-Chip Analog Test Circuit(s) is enabled to output test stimulus on ATS and input test response on ATR. The test signals passing through the connection between an analog input and analog output can be used to test the connection, or test elements in the connection such as resistors, capacitors, inductors, diodes, transformers, etc.

Figure 16:
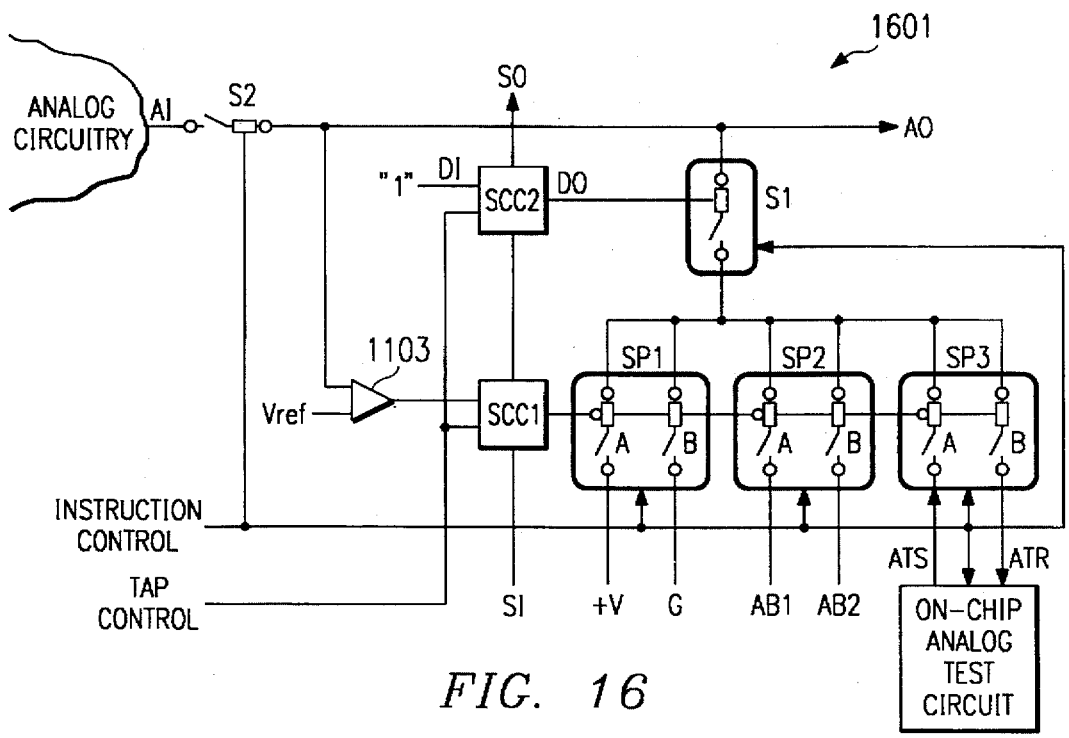
FIG. 16 illustrates another embodiment of an output analog test cell according to the invention.

While a tester connected to an analog input and an analog output, via the AB1 and AB2 IC pins, can do the same type of testing as discussed with respect to FIG. 16, the testing provided by the On-Chip Analog Test Circuit has the following exemplary advantages. The On-Chip Analog Test Circuit is embedded and always available for testing the interconnections (and elements) between analog circuit inputs and outputs, i.e. testing can occur during IC test, subassembly test, system test, and field testing and maintenance. Further, when testing interconnections (and elements) using the On-Chip Analog Test Circuit, it is not necessary to connect the analog circuit under test to an external tester (via AB1 and AB2) to perform test.

The switches illustrated in the above-described analog test cells can be implemented in many ways, for example, with suitable arrangements of field effect transistors, CMOS transistors, or bipolar transistors.

Figure 1:
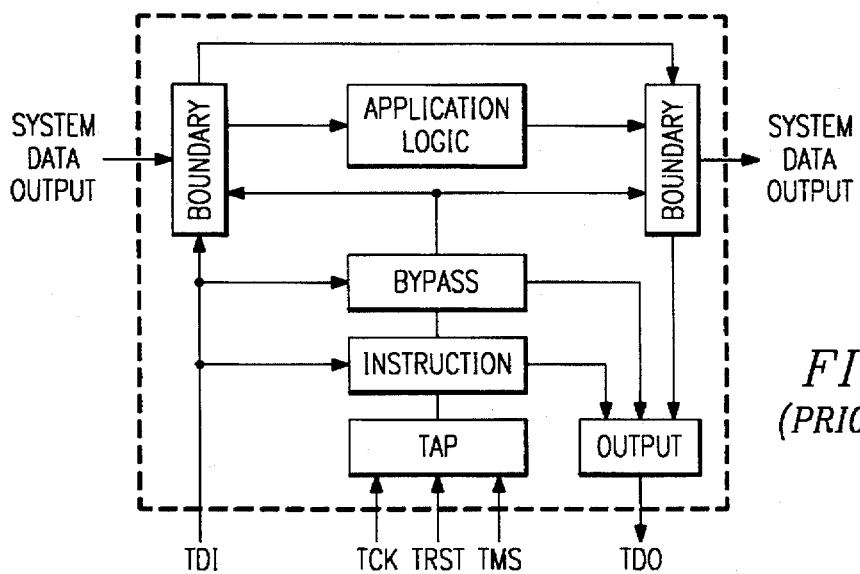
FIG. 1 is a block diagram of a prior art test architecture.
Figure 2:
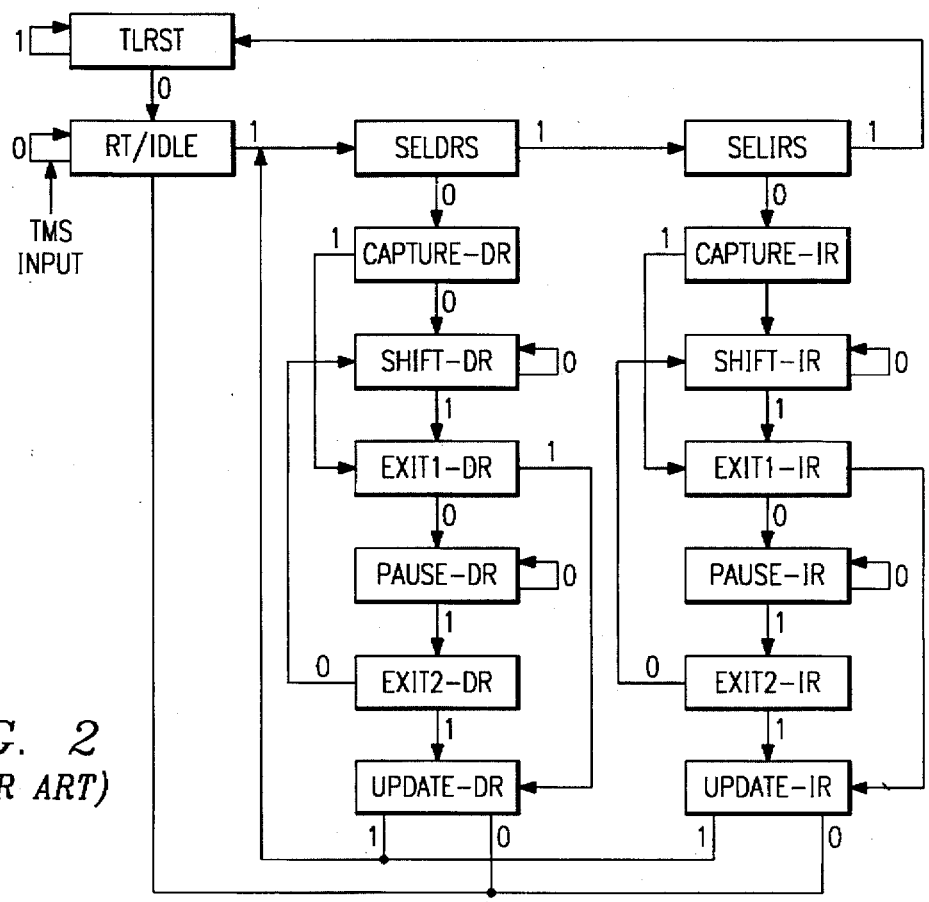
FIG. 2 is a state diagram of the test access port of FIG. 1.
Figure 3:
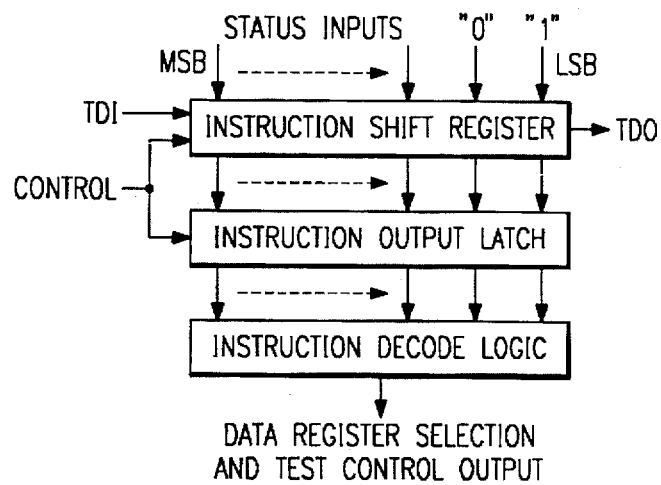
FIG. 3 illustrates the architecture of the instruction register of FIG. 1.
Figure 4A:
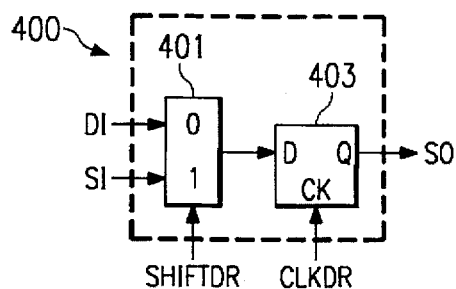
FIGS. 4A-4B illustrate a prior art input digital test cell.
Figure 4B:
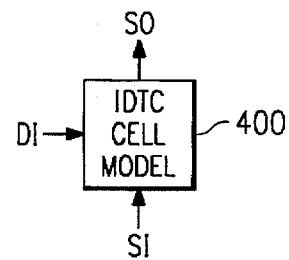
Figure 5A:
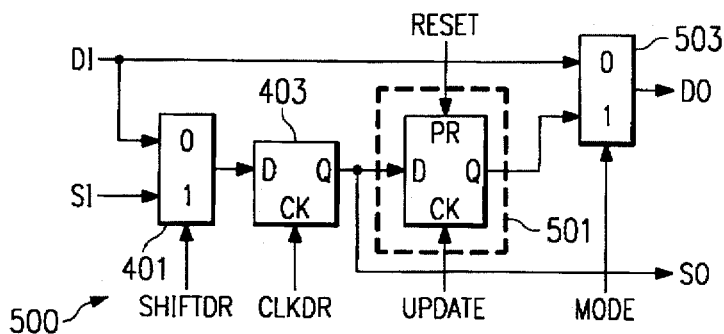
FIGS. 5A-5B illustrate a prior art output digital test cell.
Figure 5B:
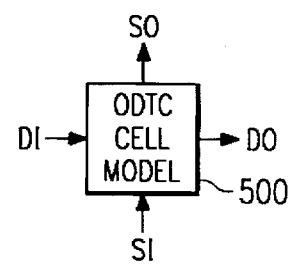
Figure 6:
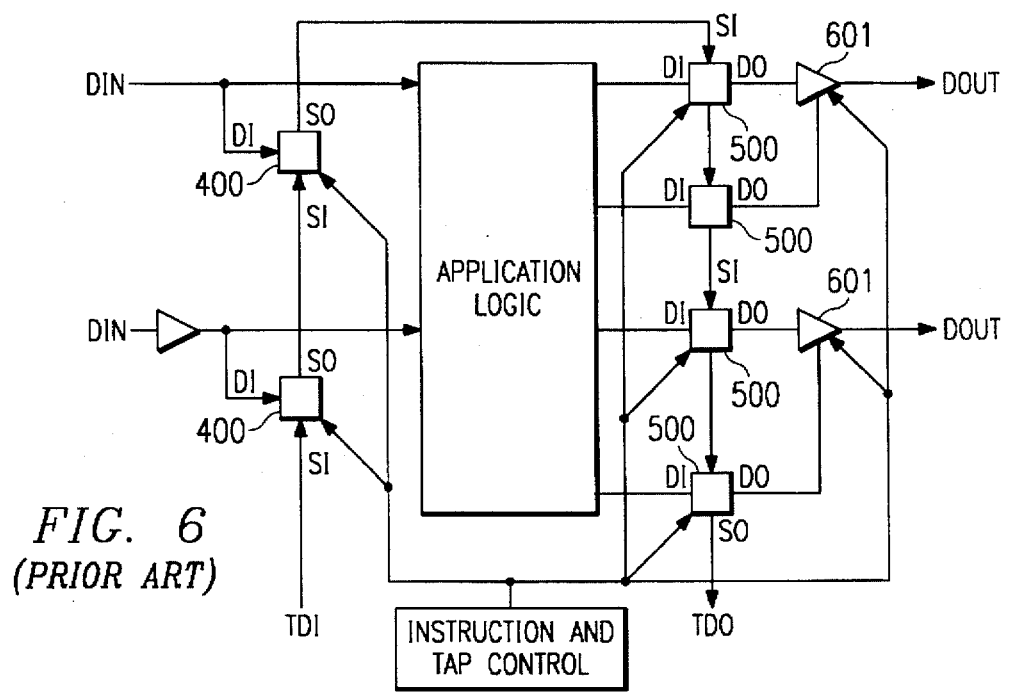
FIG. 6 illustrates the boundary scan register of FIG. 1 as implemented in the prior art using digital test cells.
Figure 7:
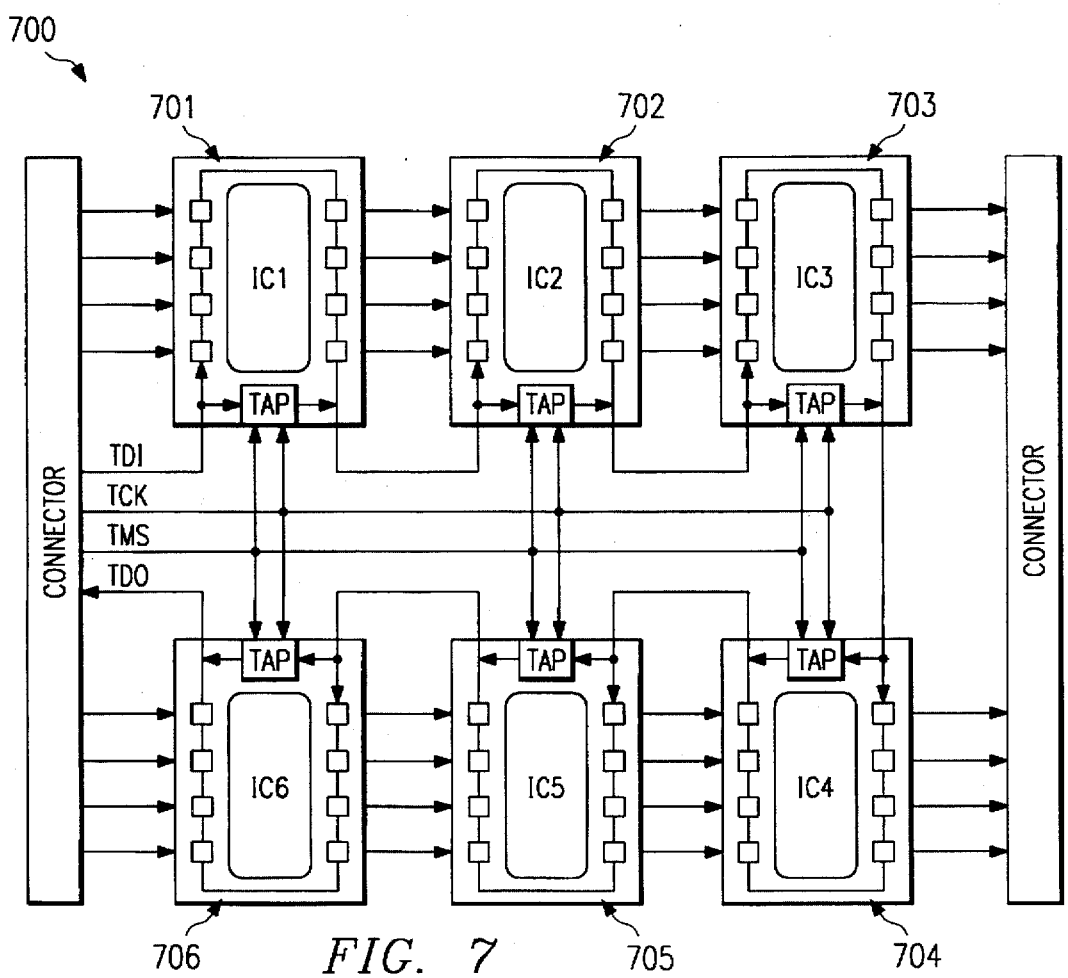
FIG. 7 illustrates a prior art arrangement wherein the FIG. 1 test architecture is applied to multiple ICs on a circuit board.

The SCCs not responsible for providing the test observation function need not perform capture operations, and so may be designed without capture capability. As one example, SCC2 of both the IOATC 1101 and the IIATC 1201 can be realized by connecting S1 of FIG. 5A directly to the D input of flip flop 403, and connecting the Q output of UR 501 directly to DO.

While instruction control is shown being input to S1, S2, SP1, and SP2 of various analog test cells above to regulate their operation, this control input could come from other sources as well. For example, the analog test cells could be used in conjunction with other test bus standards that do not have instruction registers. In that case, the control to regulate S1, S2, SP1, and SP2 may come, for example, in response to the decoding of IC test bus pins.

Although exemplary embodiments of the invention are described above, this does not limit the scope of the invention, which can be practiced in a variety of embodiments.

What is claimed is:

1. An electrical circuit with test capability, comprising:

functional circuitry for performing normal operating functions of the electrical circuit, said functional circuitry including an analog signal path for carrying an analog signal during performance of said normal operating functions;

first and second nodes for use in testing said analog signal path;

a first switching element connected to said first node and a second switching element connected to said second node, said first and second switching elements connected to one another to provide a signal path between said first and second nodes via said first and second switching elements; and a third switching element connected between said analog signal path and said first and second switching elements, said first and third switching elements cooperable to provide a first test signal path from said first node through said first and third switching elements to said analog signal path for carrying a test signal between said first node and said analog signal path, and said second and third switching elements cooperable to provide a second test signal path from said second node through said second and third switching elements to said analog signal path.

2. The electrical circuit of claim 1 including an analog test circuit connected to said first and second nodes to permit transfer of analog signals between said analog signal path and said analog test circuit via said first and second test signal paths.

3. The electrical circuit of claim 1, wherein one of said nodes is a terminal which is accessible externally of the electrical circuit.

4. The electrical circuit of claim 1, wherein said first node is a terminal which is accessible externally of the electrical circuit, and wherein said second node is a terminal which is accessible externally of the electrical circuit.

5. The electrical circuit of claim 1, wherein said electrical circuit is formed on a single integrated circuit chip.

6. An electrical circuit provided on a single integrated circuit chip, comprising:

functional circuitry for performing normal operating functions of the electrical circuit, said functional circuitry including an analog signal path which is accessible externally of the integrated circuit chip;

an analog test circuit having an output to provide on said analog signal path a test stimulus for an external circuit under test connected to said analog signal path externally of the integrated circuit chip, said analog test circuit having an input to receive a test response from an external circuit under test connected to said analog signal path externally of the integrated circuit chip; and a switching element connected between said analog signal path and one of said input and said output.

7. The electrical circuit of claim 6, wherein said switching element is connected between said analog signal path and said input, and including a further switching element connected between said analog signal path and said output.

* * * * *